United States Patent
Han et al.

(10) Patent No.: US 9,972,800 B2
(45) Date of Patent: May 15, 2018

(54) CARBON NANOTUBE FIELD-EFFECT TRANSISTOR WITH SIDEWALL-PROTECTED METAL CONTACTS

(71) Applicant: INTERNATIONAL BUSINESS MACHINES CORPORATION, Armonk, NY (US)

(72) Inventors: Shu-Jen Han, Cortlandt Manor, NY (US); Jianshi Tang, Elmsford, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 16 days.

(21) Appl. No.: 15/383,670

(22) Filed: Dec. 19, 2016

(65) Prior Publication Data

US 2017/0125711 A1    May 4, 2017

Related U.S. Application Data

(63) Continuation of application No. 14/929,099, filed on Oct. 30, 2015, now Pat. No. 9,577,204.

(51) Int. Cl.
*H01L 51/10*  (2006.01)
*H01L 51/05*  (2006.01)
*H01L 51/00*  (2006.01)

(52) U.S. Cl.
CPC ........ *H01L 51/105* (2013.01); *H01L 51/0021* (2013.01); *H01L 51/0048* (2013.01); *H01L 51/0545* (2013.01); *H01L 51/107* (2013.01); *H01L 51/0558* (2013.01)

(58) Field of Classification Search
USPC ............................................. 257/27; 438/151
See application file for complete search history.

(56) References Cited

U.S. PATENT DOCUMENTS

| | | | |
|---|---|---|---|
| 5,306,950 A | * | 4/1994 | Fujikawa ................ H01L 24/02 257/509 |
| 6,723,624 B2 | | 4/2004 | Wang et al. |
| 7,253,431 B2 | | 8/2007 | Afzali-Ardakani et al. |
| 7,705,347 B2 | | 4/2010 | Bae et al. |
| 7,902,089 B2 | | 3/2011 | Matsumoto et al. |

(Continued)

OTHER PUBLICATIONS

Chen, J., et al., "Self-aligned carbon nanotube transistors with charge transfer doping," Applied Physics Letters, No. 86, Mar. 2005. (pp. 1-3).

(Continued)

*Primary Examiner* — Jaehwan Oh
*Assistant Examiner* — Lawrence Tynes, Jr.
(74) *Attorney, Agent, or Firm* — Tutunjian & Bitetto, P.C.; Vazken Alexanian

(57) ABSTRACT

A field effect transistor includes a substrate and a gate dielectric formed on the substrate. A channel material is formed on the dielectric layer. The channel material includes carbon nanotubes. A patterned resist layer has openings formed therein. Metal contacts are formed on the channel material in the openings in the patterned resist layer and over portions of the patterned resist layer to protect sidewalls of the metal contacts to prevent degradation of the metal contacts.

8 Claims, 6 Drawing Sheets

(56) References Cited

U.S. PATENT DOCUMENTS

| | | | |
|---|---|---|---|
| 8,120,008 B2 | 2/2012 | Peng et al. | |
| 8,221,715 B2 | 7/2012 | Shin et al. | |
| 9,450,022 B1 | 9/2016 | Wheeler et al. | |
| 9,577,204 B1* | 2/2017 | Han | H01L 51/0558 |
| 2008/0063566 A1 | 3/2008 | Matsumoto et al. | |
| 2008/0233689 A1* | 9/2008 | Moriwaka | H01L 21/02532 |
| | | | 438/166 |
| 2009/0085173 A1 | 4/2009 | Boemmels et al. | |
| 2009/0275198 A1 | 11/2009 | Kamepalli et al. | |
| 2011/0062419 A1 | 3/2011 | Kikuchi et al. | |
| 2013/0089956 A1* | 4/2013 | Chang | H01L 29/775 |
| | | | 438/151 |
| 2013/0134392 A1* | 5/2013 | Afzali-Ardakani | H01L 29/778 |
| | | | 257/29 |
| 2014/0138625 A1* | 5/2014 | Franklin | B82Y 10/00 |
| | | | 257/29 |

OTHER PUBLICATIONS

He, Y., et al., "Schottky Barrier Formation at a Carbon Nanotube—Scandium Junction," Chinese Physics Letters, vol. 26, No. 2, Feb. 2009. (pp. 1-3).

Javey, et al., "High Performance n-Type Carbon Nanotube Field-Effect Transistors with Chemically Doped Contacts," Nano Letters, vol. 5, Issue 2, Feb. 2005. (pp. 1-4).

Shahrjerdi, D. et al., "High-Performance Air-Stable n-Type Carbon Nanotube Transistors with Erbium Contacts," ACS Nano, vol. 7, No. 9, Sep. 2013. (pp. 1-6).

Zhang, Z. et al., "Doping-Free Fabrication of Carbon Nanotube Based Ballistic CMOS Devices and Circuits," Nano Letters, vol. 7, No. 12, Nov. 2007. (pp. 1-5).

List of IBM Patents or Patent Applications Treated as Related dated Dec. 19, 2016, 2 pages.

Office Action Issued in U.S. Appl. No. 15/207,938 dated Aug. 21, 2017, pp. 1-11.

* cited by examiner

CARBON NANOTUBE FIELD-EFFECT TRANSISTOR WITH SIDEWALL-PROTECTED METAL CONTACTS

BACKGROUND

Technical Field

The present invention relates to transistor devices, and more particularly to carbon nanotube transistors with protected metal contacts.

Description of the Related Art

Among all the candidate materials for post-silicon era, carbon nanotubes (CNTs) have intrinsic ultra-thin body and exceptional electrical properties (high on current, superior current on/off ratio, long mean-free-path for ballistic transport, etc.), which makes them one of the most promising candidates for sub-10 nm technology node in semiconductor industry. The implementation of CNT-based complementary metal oxide semiconductor (CMOS) technology with low standby power dissipation requires both robust high-performance n-type field effect transistors (NFETs) and p-type field effect transistors (PFETs), which are usually realized by using low- and high-work function metal contacts to the intrinsic (undoped) CNT channel, respectively.

While CNT p-type metal contacts (typically Pd) have been extensively studied and proven to be air-stable and robust, n-type metal contacts (typically Sc and Er) are usually prone to react with oxygen and hence suffer from severe degradation over time through oxidation in air. This oxidation problem leads to low-yield and unstable NFETs in device fabrication. To avoid the oxidation of CNT n-type metal contact, another layer of metal (typically Au) is usually deposited on top to prevent the oxidation from the top surface. However, oxidation from the sidewalls could still dramatically degrade the contact properties.

SUMMARY

A field effect transistor includes a substrate and a gate dielectric formed on the substrate. A channel material is formed on the dielectric layer. The channel material includes carbon nanotubes. A patterned resist layer has openings formed therein. Metal contacts are formed on the channel material in the openings in the patterned resist layer and over portions of the patterned resist layer to protect sidewalls of the metal contacts to prevent degradation of the metal contacts.

A field effect transistor includes a semiconductor substrate configured to form a gate electrode, a gate dielectric formed on the substrate and carbon nanotubes formed on the dielectric layer to form a channel. A patterned resist layer has openings formed therein, and n-type metal contacts are formed on the carbon nanotubes in the openings in the patterned resist layer. The metal contacts include extension regions which are formed over a portion of a top surface of the patterned resist layer to protect sidewalls of the metal contacts to prevent degradation of the metal contacts. A dielectric material is patterned over the metal contacts and the patterned resist layer to open contact windows to the metal contacts.

A method for forming a field effect transistor includes forming a gate dielectric on a semiconductor substrate; aligning carbon nanotubes on the gate dielectric layer; patterning a first resist layer to form openings therein; patterning a second resist layer on the first resist layer; depositing metal on the carbon nanotubes in the openings through the first resist layer and over the first and second resist layers; and lifting off the second resist layer to form metal contacts where the sidewalls of the metal contacts are protected by the first resist layer to prevent degradation of the metal contacts.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein.

DETAILED DESCRIPTION

Figure 1:
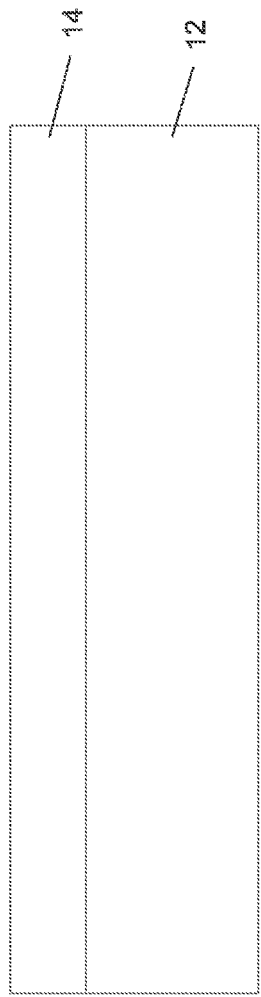
FIG. 1 is a cross-sectional view for a semiconductor device showing a dielectric layer (gate dielectric) formed on a highly doped substrate (gate electrode) in accordance with the present principles.

In accordance with the present principles, devices and methods for making the devices are provided to address the oxidation problem that leads to low-yield and unstable n-type field effect transistors (NFETs) in device fabrication with carbon nanotubes (CNT). In useful embodiments, a protective pattern forms metal contacts over its sidewalls to protect metal contacts for CNT NFETs from oxidation. While different materials may be employed form the protective pattern, in one embodiment, the protective pattern includes hydrogen silsesquioxane (HSQ), which can be reduced to silicon oxide after e-beam exposure. An overlapping portion of the metal contacts may is formed over the protective pattern and employed to further protect the metal contacts to from oxidation.

While CNT p-type metal contacts include inert Pd, n-type metal contacts including Sc or Er react with oxygen and suffer from severe degradation leading to low-yield and unstable NFETs. In accordance with the present principles, the oxidation problem is addressed using contact protection patterns resulting in increased yield and CNT NFETs with greater stability.

It is to be understood that the present invention will be described in terms of a given illustrative architecture; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present embodiments may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Referring now to the drawings in which like numerals represent the same or similar elements and initially to FIG. 1, a partially fabricated semiconductor device 10 is shown in accordance with the present principles. The device includes a substrate 12. The substrate 12 may include a Si substrate; however, any suitable substrate may be employed. For example, the substrate 12 may include Si, SiGe, Ge, III-V materials, etc. A dielectric layer 14 is deposited on the substrate 12. The dielectric layer 14 may include a grown oxide, a deposited oxide, a deposited nitride or other suitable dielectric material. If a deposited oxide is employed, the deposited oxide may include a high-k dielectric material. Other dielectric materials may also be employed. The dielectric layer 14 is employed as a gate dielectric for the substrate 12, which functions as a gate electrode in the completed device. The substrate 12 is highly doped to provide conditions for applying a voltage to carbon nanotubes (CNTs) as a gate electrode, as will be described.

Figure 2:
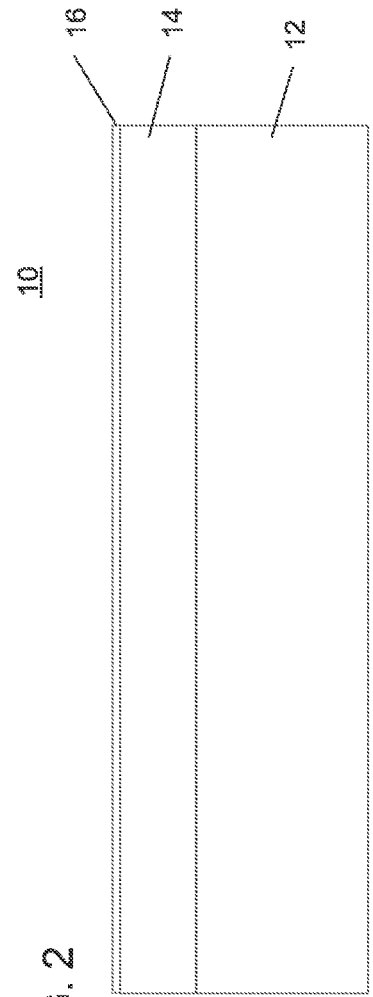
FIG. 2 is a cross-sectional view for the semiconductor device of FIG. 1 showing carbon nanotubes (CNT) aligned on the dielectric layer to form a device channel for a field effect transistor (FET) device to be formed in accordance with the present principles.

Referring to FIG. 2, highly purified CNTs 16 are aligned on the dielectric layer 14. The alignment of the CNTs may include placing the CNTs on the dielectric layer 14 or forming the CNTs on the dielectric layer 14. Any suitable placement method or growth method may be employed to provide the CNTs 16. One approach to control the placement/alignment of CNTs 16 is to control sites from which nanotubes are grown by patterning catalyst particles on the dielectric layer 14. Patterned growth using a catalyst patterned on $SiO_2$/Si wafers can provide location control with chemical vapor deposition (CVD) growth of nanotubes from the catalyst islands.

Single catalyst-nanoparticle patterning may include the formation of arrays of regularly spaced catalyst (e.g., Fe or Co) nanoparticles on $SiO_2$/Si (layer 14/substrate 12) by high-resolution electron-beam (e-beam) lithography (EBL). In other embodiments, formed CNTs 16 are stretched across the dielectric layer 16 as a CNTs sheet. The CNT sheet can later be patterned as needed. Other suitable processes may be employed to form CNTs 16 on the dielectric layer 14.

Figure 3:
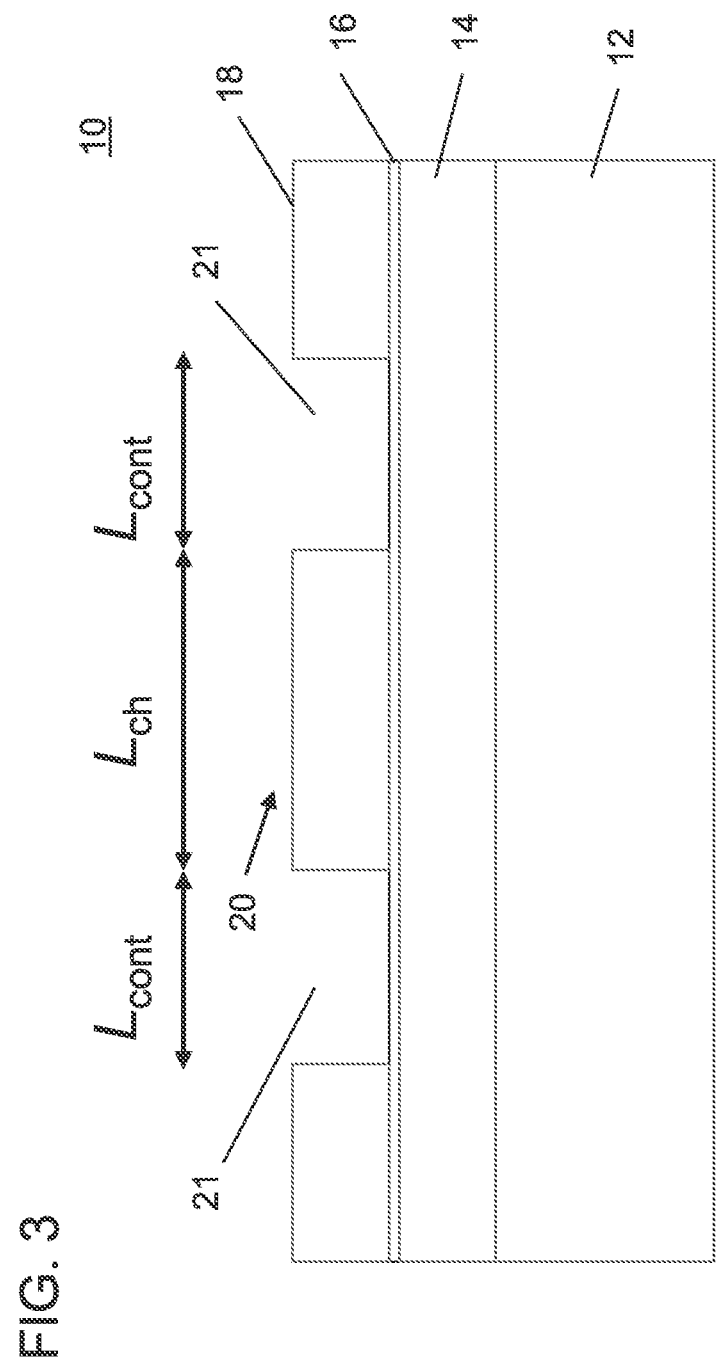
FIG. 3 is a cross-sectional view for the semiconductor device of FIG. 2 showing a patterned resist layer formed on the carbon nanotubes and having openings formed therein to locate metal contacts (source and drain regions) in accordance with the present principles.

Referring to FIG. 3, a resist layer 18 is formed over the CNTs 16 and patterned to form a pattern 20 for the formation of electrical contacts (to define a length $L_{cont}$ for the contacts) for a field effect transistor device to be formed using the CNTs 16 as a channel for the device. The pattern 20 also defines a channel length ($L_{ch}$). The resist layer 18 may include a hydrogen silsesquioxane (HSQ) resist layer 18. Other resist or dielectric materials may be employed instead of HSQ; however, HSQ is easily patterned using e-beam lithography, which converts the HSQ to $SiO_2$, which can be easily removed with known etching techniques. The resist layer 18 may be deposited by a spin coat process and patterned with e-beam lithography. The resist layer 18 is reduced to $SiO_2$ after e-beam exposure to form contact openings 21 ($L_{cont}$) after an etched process. The openings 21 define locations for metal contacts, which will function as sources and drains for the CNT FET to be formed.

Figure 4:
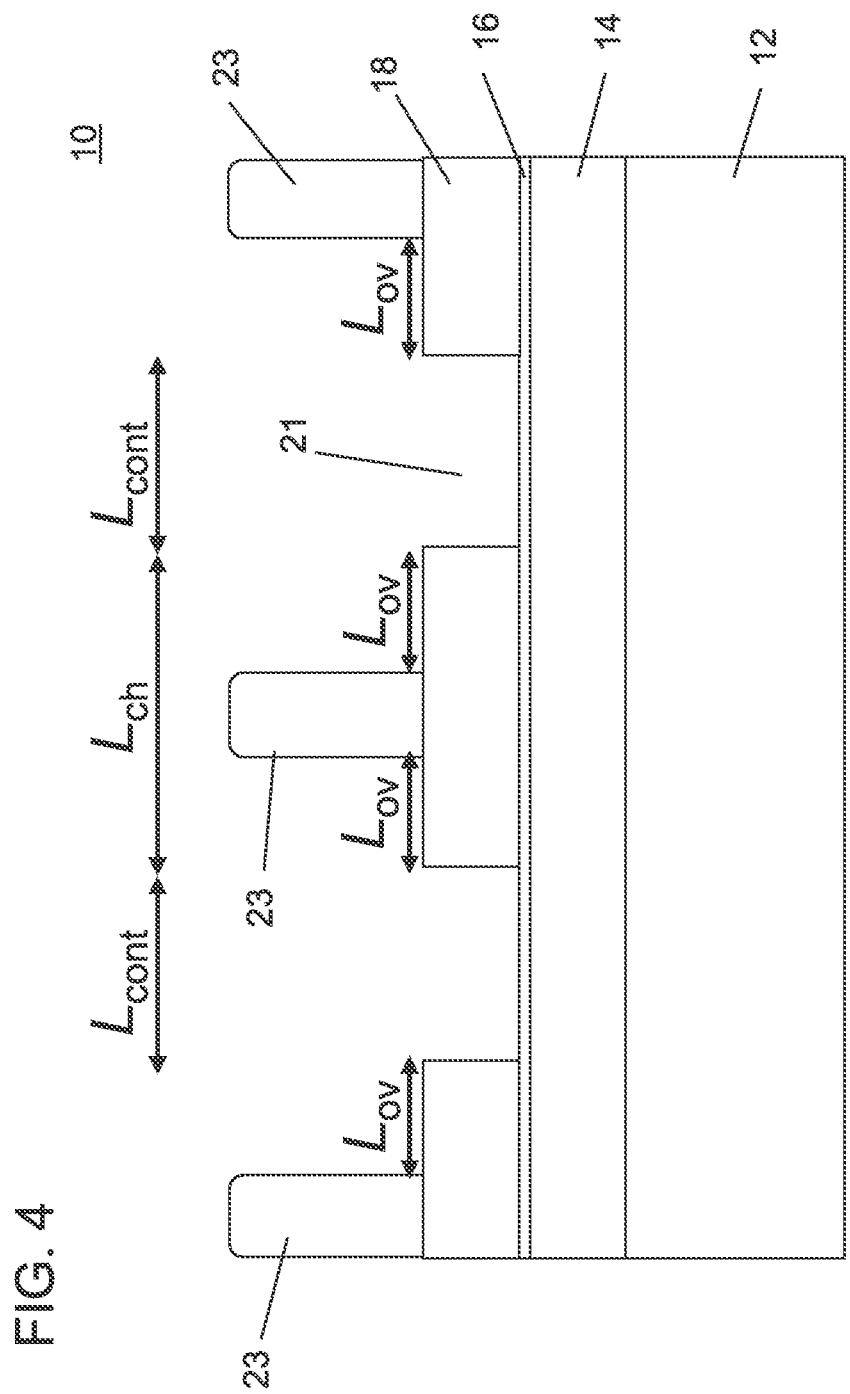
FIG. 4 is a cross-sectional view for the semiconductor device of FIG. 3 showing a second resist patterned on the first resist in accordance with the present principles.

Referring to FIG. 4, a second resist material 23 is deposited (e.g., spun on) and patterned over the resist layer 18. The pattern of the second resist layer 23 will be employed in a liftoff process for metal contact formation. The second resist material 23 may include poly(methyl methacrylate) (PMMA) or other resists that may be employed in a liftoff process. The resist material 23 may be patterned using e-beam lithography. Since it is challenging to define a PMMA pattern with exactly the same openings as the underlying (HSQ) pattern, a small overlap ($L_{ov}$) may be defined to accommodate possible misalignment with the openings 21 in the resist layer 18.

Figure 5:
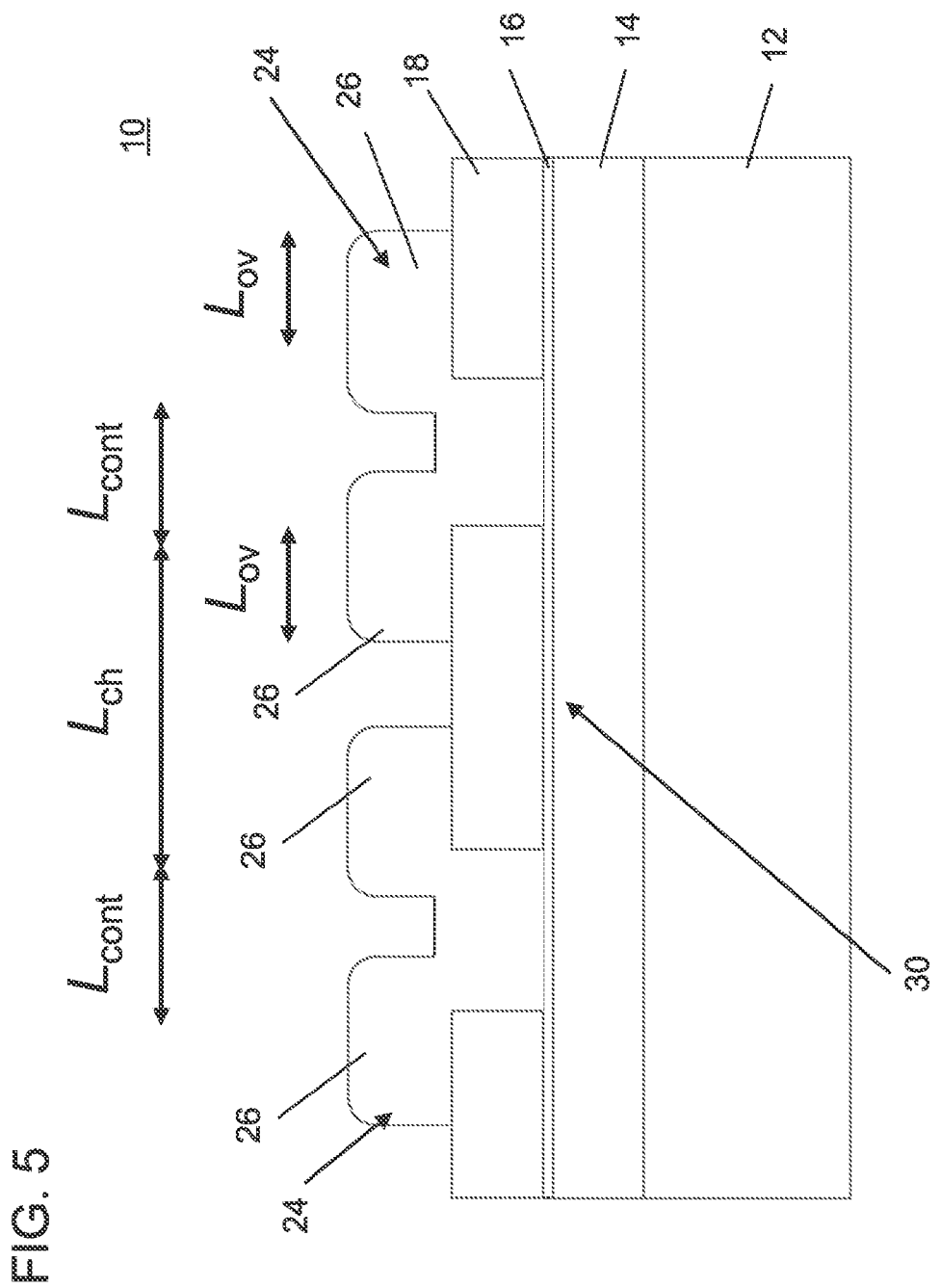
FIG. 5 is a cross-sectional view for the semiconductor device of FIG. 4 showing metal contacts formed through on the second resist layer using a liftoff process in accordance with the present principles.

Referring to FIG. 5, metal contacts 24 are formed in the openings 21 (FIG. 4). The metal material for contacts 24 is formed by depositing the contact material over the resist layer 23 (e.g., PMMA). The metal deposition process may include any suitable deposition process, e.g., sputtering, evaporation, CVD, etc. The metal material forms in the openings 21, over the resist 23 and over the resist 18 in the overlap regions ($L_{ov}$).

Then, a liftoff process is performed to breakdown the resist 23 and remove the metal from over the resist 23. The metal remaining in the openings 21 and the overlap regions ($L_{ov}$) forms the contacts 24. The metal for the contacts 24 may include Er, Sc, La, Y, Ti or other suitable n-type materials for NFETs. The contacts 24 function as source and drain regions for a field effect transistor (FET) device 30 formed with the CNT 16 as the device channel.

In one embodiment, the contacts 24 may include a bilayer of metal materials. The bilayer may include an n-type material followed by a protective material. For example, a Sc, Er, La, Y or Ti layer (n-type metal) is formed followed by a layer of Au, Pt or other inert, highly conductive material (protective metal). The inert, highly conductive material may be formed to protect a top surface of the contacts 24 while the resist 18 protects the sidewalls of the contacts 24. The inert, highly conductive material is deposited after the first metal for the contacts 24 and is patterned using the same liftoff process. Here, inert particularly refers to resistance to oxidation but protection from other reactants is also included.

To further protect the contacts 24 from oxidation, the contacts 24 extend over the resist 18 in the overlap regions ($L_{ov}$) to further protect sidewalls of the contacts 24 (in contact with resist 18). Extension portions 26 of contacts 24 prevent oxidation of the contact at or near the CNT layer 16. Extension portions 26 also reduce contact resistance.

Figure 6:
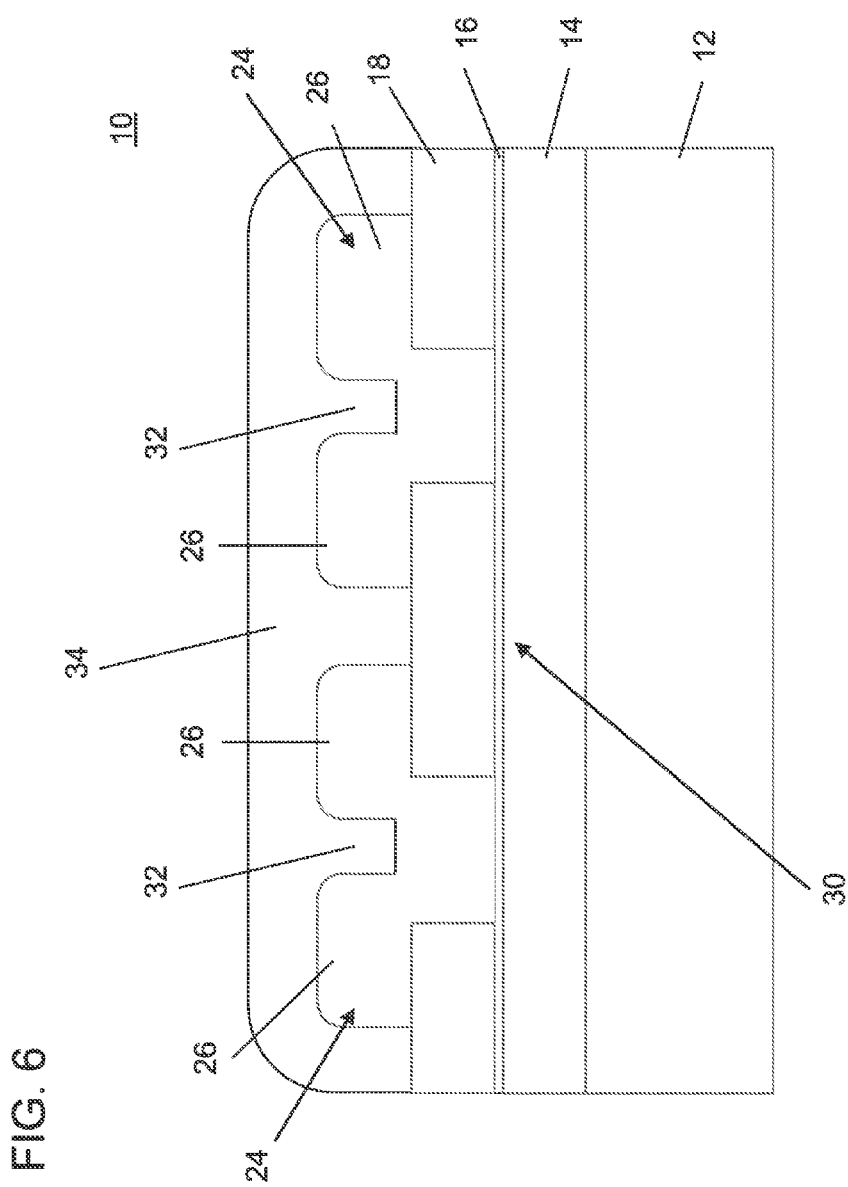
FIG. 6 is a cross-sectional view for the semiconductor device of FIG. 5 showing a dielectric layer formed over the metal contacts in accordance with the present principles.
Figure 7:
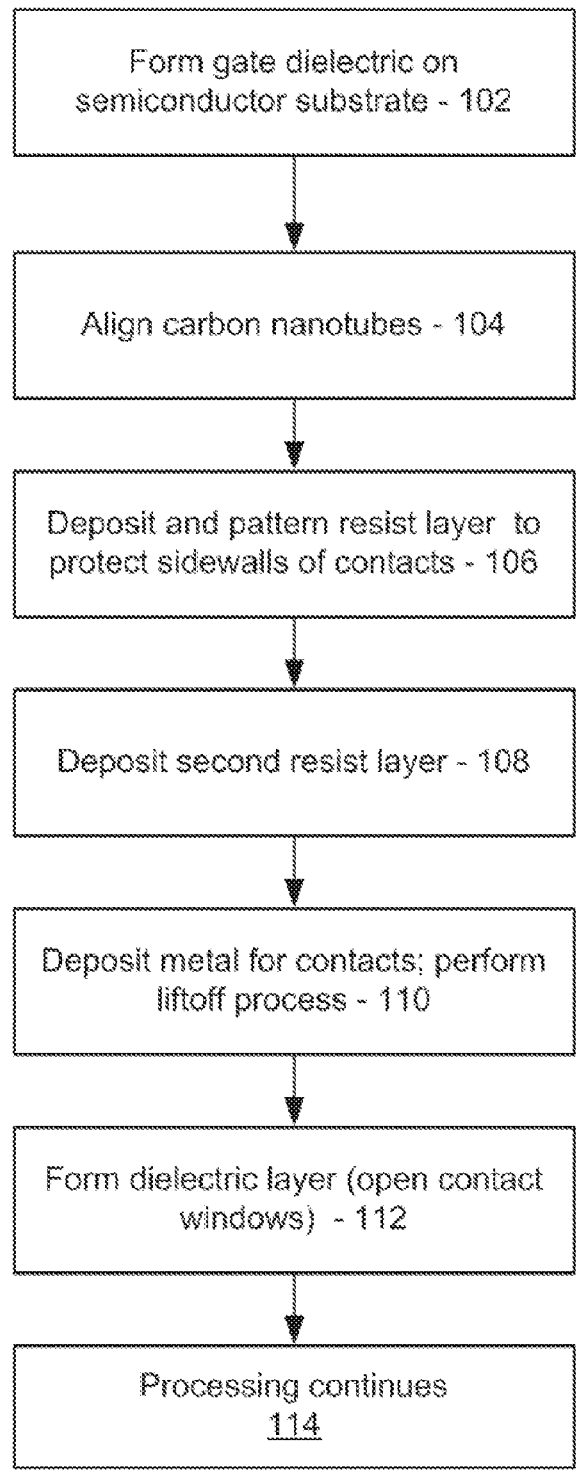
FIG. 7 is a block/flow diagram showing methods for forming a CNT field effect transistor in accordance with illustrative embodiments.

Referring to FIG. 6, a dielectric material 34 is formed over the device 30. The dielectric layer 34 may be employed for forming vias and other metallizations to connect to the contacts 24. The dielectric material 34 may be formed using an atomic layer deposition (ALD) process, although other deposition processes may be employed. A pad open process may be employed to form openings (not shown) through dielectric material 34 to access the contacts 24 in a trench 32 formed in the contacts 24 or on the contact extensions 26. Additional metals may be formed to make connections to the contacts 24 through the openings (contact windows). In one embodiment, the dielectric material 34 includes $Al_2O_3$ deposited using ALD and patterned using lithography to form contact windows.

The completed device 10 is preferably an NFET device since the n-type contact metals for NFETs suffer more from oxidation than the metals (e.g., Pd) employed for PFET devices. However, the present principles may be employed for PFET devices as well. In particularly useful embodiments, the channel length ($L_{ch}$) may be between about 200 nm and 300 nm and nominally about 250 nm. The contact length ($L_{cont}$) may be between about 30 nm and 1200 nm. The overlap length ($L_{ov}$) may be about 40 nm to about 60 nm, nominally about 50 nm. While the present dimensions are provided, these dimensions should not be construed as limiting as other dimensions may be employed in accordance with the present principles.

In tests performed in accordance with the present principles, yield was measured for CNT NFETs with HSQ sidewall protection. The CNT NFETs with sidewall protection showed improvements in yield and reduced device variation. In one particular study, CNT NFETs with Sc contacts ($L_{cont}$=1000 nm) and sidewall protection (HSQ) had their yield close to that of CNT PFETs with Pd contacts ($L_{cont}$=1000 nm) without sidewall protection. The NFETs with HSQ-protected Sc contacts (yield=95.2%) showed a higher yield than NFETs with Sc without HSQ-protected sidewalls (yield=82.1%).

In another study in accordance with the present principles, CNT NFETs with small Sc contacts ($L_{cont}$=40 nm) had an even more pronounced yield improvement. The CNT NFETs with $L_{cont}$=40 nm and sidewall protection (HSQ) were compared with CNT NFETs with $L_{cont}$=100 nm without sidewall protection (HSQ) (conventional structure). The NFETs with HSQ-protected Sc contacts ($L_{cont}$=40 nm) (yield=49.3%) showed a higher yield than NFETs without HSQ-protected sidewalls ($L_{cont}$=100 nm) (yield=14.0%).

Referring to FIG. 5, methods for forming field effect transistors are shown in accordance with the present principles. In some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

In block 102, a gate dielectric is formed on a semiconductor substrate. The gate dielectric layer may include a grown or deposited dielectric material. The dielectric material may include an oxide, such as a silicon oxide or a high-k dielectric material such as, e.g., $Al_2O_3$. Other gate dielectrics may also be employed. The semiconductor substrate may include any suitable semiconductor material that can be doped to form a gate electrode. In some embodiments, the gate electrode can be a patterned metal electrode that has a top surface planarized for high speed switching. The gate electrode (metal) would be formed corresponding to the channel region ($L_{ch}$).

In block 104, carbon nanotubes are aligned on the dielectric layer. The carbon nanotubes may be placed on the dielectric layer or may be formed on the dielectric layer. The carbon nanotubes are aligned to form a channel region for a field effect transistor to be formed.

In block 106, a first resist layer is deposited (e.g., by a spin on process) on the carbon nanotubes. The first resist layer is patterned to form openings therein. The patterning of the first resist layer may include electron beam lithography, although other patterning processes may be employed. The patterned first resist layer may include hydrogen silsesquioxane (HSQ) or other resist material. The portions of the HSQ to be removed maybe irradiated using an electron beam, which alters the material. The HSQ can be converted to silicon oxide (e.g., silicon dioxide) by the electron beam. The altered material (silicon oxide) may then be removed using an etching process to form the pattern.

The patterning of the first resist layer defines a channel length ($L_{ch}$) and contact lengths ($L_{cont}$) of the metal contacts by forming portions of the first resist layer to protect portions of the carbon nanotubes underlying the first resist layer.

In block 108, a second resist layer is formed and patterned on the first resist layers. The second resist layer and the first resist layer combine to provide a patterned shape for forming source and drain contacts. The second resist pattern is offset from end portions of the first resist. The second resist layer is employed as a liftoff resist.

In block 110, metal contacts are deposited on the carbon nanotubes in the openings in the patterned first resist layer and over the patterned first and second resist layers. A liftoff process is preformed to remove the second resist pattern to shapes the contacts. The contacts have sidewalls protected by the first resist layer and include contacts to prevent degradation of the metal contacts over the CNT in the openings. The liftoff process removes metal from regions where the second resist was formed.

The metal contacts may an n-type metal to form the metal contacts. In one embodiment, the resist for the liftoff process is formed. Then, the n-type metal (e.g., Sc or Er) is deposited over the liftoff resist. Then, a protective metal (e.g., Au) is formed on the n-type metal. Then, in accordance with the liftoff process, the liftoff resist is removed forming the metal contacts.

In block 112, a dielectric material may be formed over the patterned metal contacts. The dielectric material covers the metal contacts and may be patterned to open contact windows. The dielectric layer may be formed using an ALD process although other formation processes may be employed. The dielectric layer may be patterned using a pad open process (lithography).

In block 114, processing may continue to complete the transistor device. This may include forming interlevel dielectric layers, self-aligned contacts, vias and other metallizations, etc.

Having described preferred embodiments for carbon nanotube field-effect transistor with sidewall-protected metal contacts (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A method for forming a field effect transistor, comprising:
    patterning a first resist layer on carbon nanotubes to form openings in the resist layer;
    patterning a second resist layer on the first resist layer;
    depositing metal on the carbon nanotubes in the openings through the first resist layer and over the first and second resist layers; and
    lifting off the second resist layer to form metal contacts where sidewalls of the metal contacts are protected by the first resist layer to prevent degradation of the metal contacts.

2. The method as recited in claim 1, wherein patterning the first resist layer includes patterning the first resist layer using electron beam lithography.

3. The method as recited in claim 1, wherein the first resist layer includes hydrogen silsesquioxane (HSQ) and the method further comprising etching the HSQ to convert the HSQ to silicon oxide by the electron beam.

4. The method as recited in claim 1, wherein patterning the second resist layer includes forming overlap regions by offsetting the second resist from the openings in the first resist.

5. The method as recited in claim 1, wherein depositing the metal contacts includes depositing a protective metal on an n-type metal to form the metal contacts.

6. The method as recited in claim 5, wherein the n-type metal includes Sc or Er and the protective material includes Au.

7. The method as recited in claim 1, wherein depositing the metal includes forming extension contact regions over top portions of the first resist layer.

8. The method as recited in claim 1, wherein patterning the first resist layer includes defining a channel length and contact lengths of the metal contacts by forming portions of the first resist layer to protect portions of the carbon nanotubes underlying the first resist layer.

\* \* \* \* \*